US006677286B1

(12) United States Patent
Rovito et al.

(10) Patent No.: US 6,677,286 B1
(45) Date of Patent: Jan. 13, 2004

(54) COMPOSITIONS FOR REMOVING ETCHING RESIDUE AND USE THEREOF

(75) Inventors: Roberto John Rovito, Quakertown, PA (US); David Barry Rennie, Bethlehem, PA (US); Dana L. Durham, Pittstown, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/191,060

(22) Filed: Jul. 10, 2002

(51) Int. Cl.[7] .............................................. C09K 13/00
(52) U.S. Cl. ................... 510/175; 510/405; 510/434; 510/435; 510/477; 510/488; 510/493; 510/499; 510/504; 510/506; 252/79.1; 252/79.2; 252/79.3; 252/79.4; 252/79.5
(58) Field of Search ................... 510/175, 405, 510/477, 488, 493, 499, 434, 435, 504, 506; 252/79.1, 79.5, 79.3, 79.2, 79.4

(56) References Cited

U.S. PATENT DOCUMENTS

| 5,320,709 A | 6/1994 | Bowden et al. |
| 5,571,447 A | 11/1996 | Ward et al. |
| 5,676,760 A | 10/1997 | Aoki et al. |
| 5,698,503 A | 12/1997 | Ward et al. |
| 5,792,274 A | 8/1998 | Tanabe et al. ................ 134/1.3 |
| 5,795,702 A | 8/1998 | Tanabe et al. ................ 430/331 |
| 5,972,862 A | 10/1999 | Torii et al. ................... 510/175 |
| 5,981,454 A | 11/1999 | Small ........................... 510/175 |
| 6,030,932 A * | 2/2000 | Leon et al. .................... 510/175 |
| 6,068,000 A | 5/2000 | Tanabe et al. ................ 134/1.3 |
| 6,117,783 A | 9/2000 | Small et al. |
| 6,231,677 B1 | 5/2001 | Ishikawa et al. ................ 134/3 |
| 6,235,693 B1 * | 5/2001 | Cheng et al. ................ 510/175 |
| 6,248,704 B1 | 6/2001 | Small ........................... 510/176 |
| 6,268,323 B1 * | 7/2001 | Honda et al. ................ 510/176 |
| 6,361,712 B1 * | 3/2002 | Honda et al. ................ 252/79.3 |
| 6,372,410 B1 * | 4/2002 | Ikemoto et al. ............. 430/318 |
| 6,514,352 B2 * | 2/2003 | Gotoh et al. .................... 134/3 |
| 2002/0107158 A1 * | 8/2002 | Peters et al. ................. 510/175 |

OTHER PUBLICATIONS

U.S. patent application Ser. No. 09/238,851 filed May 31, 2001.

* cited by examiner

*Primary Examiner*—Sharidan Carrillo
(74) *Attorney, Agent, or Firm*—Connolly Bove Lodge & Hurtz LLP

(57) ABSTRACT

Compositions containing water, an organic dicarboxylic acid, a buffering agent and fluorine source and optionally a water miscible organic solvent are capable of removing etching residue.

15 Claims, 6 Drawing Sheets

COMPOSITIONS FOR REMOVING ETCHING RESIDUE AND USE THEREOF

TECHNICAL FIELD

The present invention is concerned with selectively removing etching residues from a microstructure of an object. The present invention selectively removes residues without attacking metal and or silicon dioxide films exposed to the composition used for removing the residues. In addition, the present invention is concerned with certain cleaning compositions that are suitable for removing etching residues.

BACKGROUND ART

Numerous steps are involved in the fabrication of microelectronic structures. Within the manufacturing scheme of fabricating integrated circuits selective etching of semiconductor surfaces is sometimes required. Historically, a number of vastly different types of etching processes, to selectively remove material, have been successfully utilized to varying degrees. Moreover, the selective etching of different layers, within the microelectronic structure, is considered a critical and crucial step in the integrated circuit fabrication process.

Increasingly, reactive ion etching (RIE) is the process of choice for pattern transfer during via, metal line and trench formation. For instance, complex semi-conductor devices such as advanced DRAMS and microprocessors, which require multiple layers of back end of line interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, AlCu, Cu, Ti, TiN, Ta, TaN, W, TiW, silicon or a silicide such as a silicide of tungsten, titanium or cobalt. The RIE process typically leaves a residue (of a complex mixture) that may include re-sputtered oxide material as well as possibly organic materials from photoresist and antireflective coating materials used to lithographically define the vias, metal lines and or trench structures.

It would therefore be desirable to provide a selective cleaning material and process capable of removing the residues caused by selective etching using plasmas in general and RIE specifically. Moreover, it would be desirable to provide a selective cleaning material and process, capable of removing the etching residue, that exhibits high selectivity for the residue as compared to metal, silicon, silicide and/or interlevel dielectric materials such as deposited oxides that might also be exposed to the cleaning composition.

SUMMARY OF INVENTION

The present invention provides compositions capable of selectively removing etching residue from a substrate without attacking metal that might also be exposed to the composition. In addition, the present invention provides compositions that exhibit minimal silicon oxide and in general lower dielectric etch rates.

More particularly, the present invention relates to a composition suitable for removing etching residue that comprises:

A. up to about 80% of a water miscible organic solvent;
B. About 5 to about 50% by weight of water;
C. About 1 to about 20% by weight of a dicarboxylic organic acid;
D. About 1 to about 20% by weight of a base; and
E. About 0.1 to about 10% by weight of a source of fluoride ion. The base D in combination with the dicarboxylic acid C forms a buffering agent.

The present invention also relates to a method for removing etching residue from a substrate that comprises contacting the substrate with the above-disclosed composition.

Other objections and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description and drawings are to be regarded as illustrative in nature and not as restrictive.

BEST AND VARIOUS MODES FOR CARRYING OUT INVENTION

Figure 1:
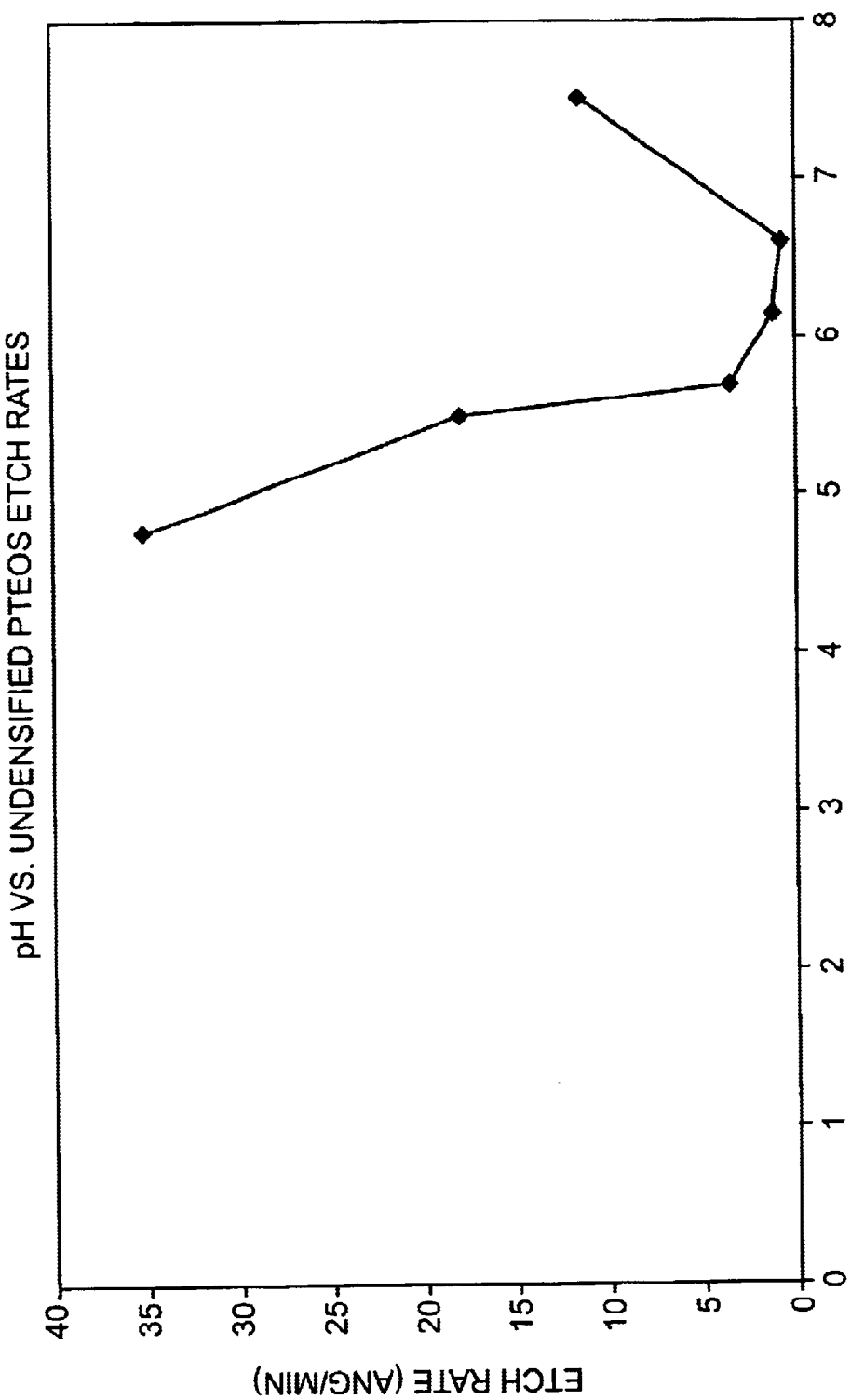
FIG. 1 illustrates phosphorous doped un-densified TEOS etch rates of various diacid-containing formulations at the different pHs.
Figure 2:
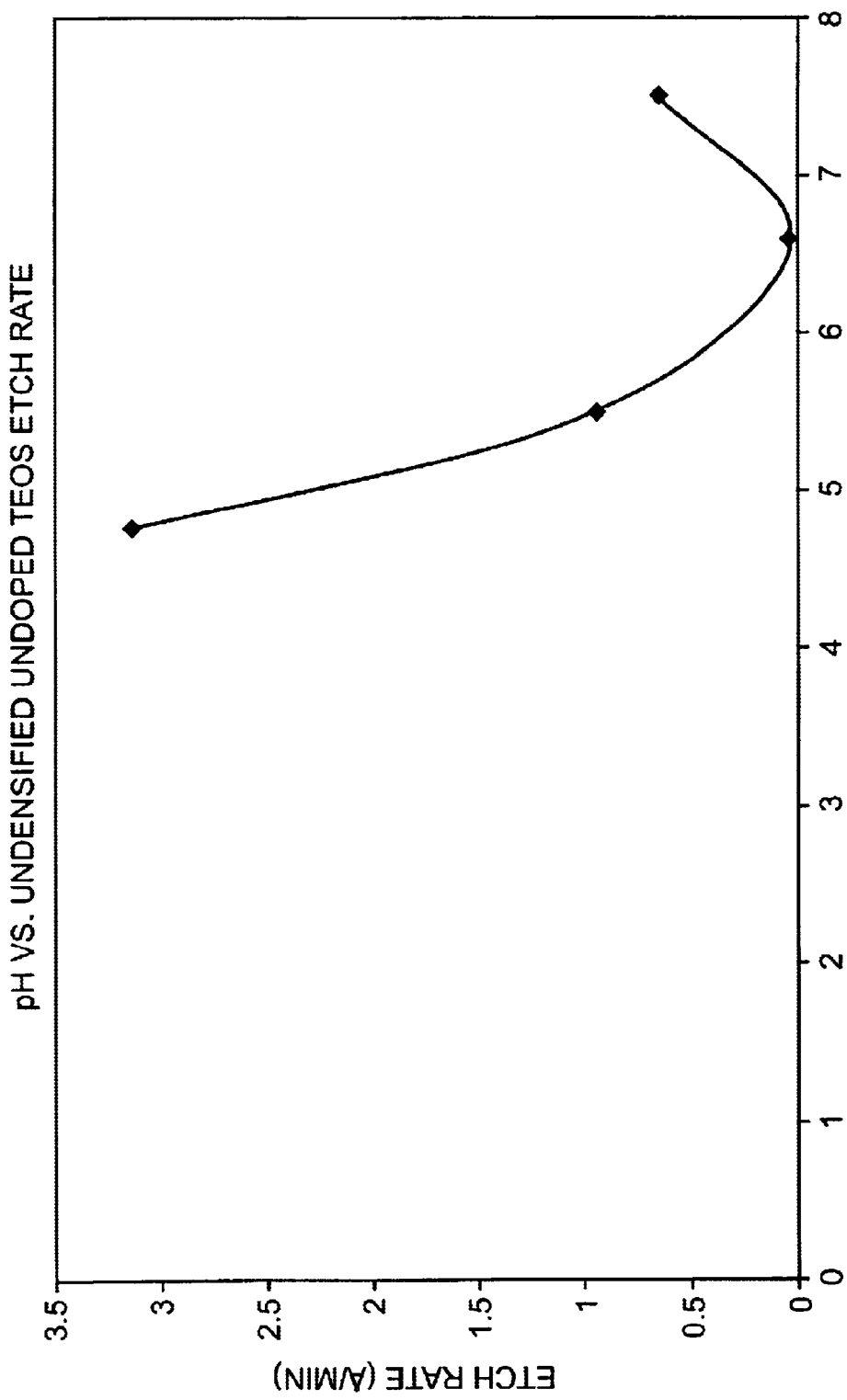
FIG. 2 illustrates undensified undoped TEOS etch rates of various diacid-containing formulations of different pHs.
Figure 3:
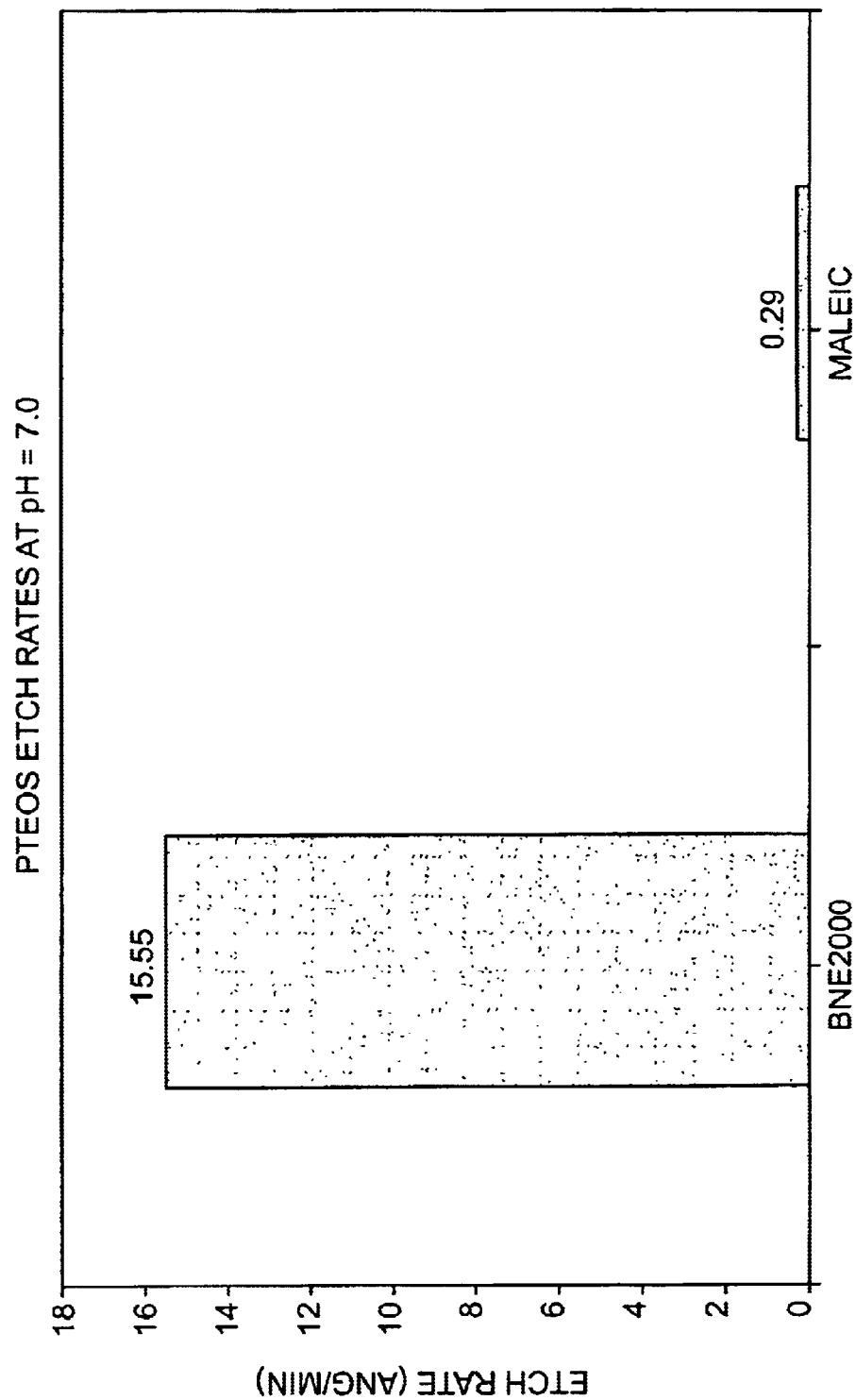
FIG. 3 illustrates the PTEOS etch rates of a maleic acid buffered fluoride stripper and an aminosulfonic acid buffered fluoride stripper, both with the pH adjusted to 7.0.
Figure 4:
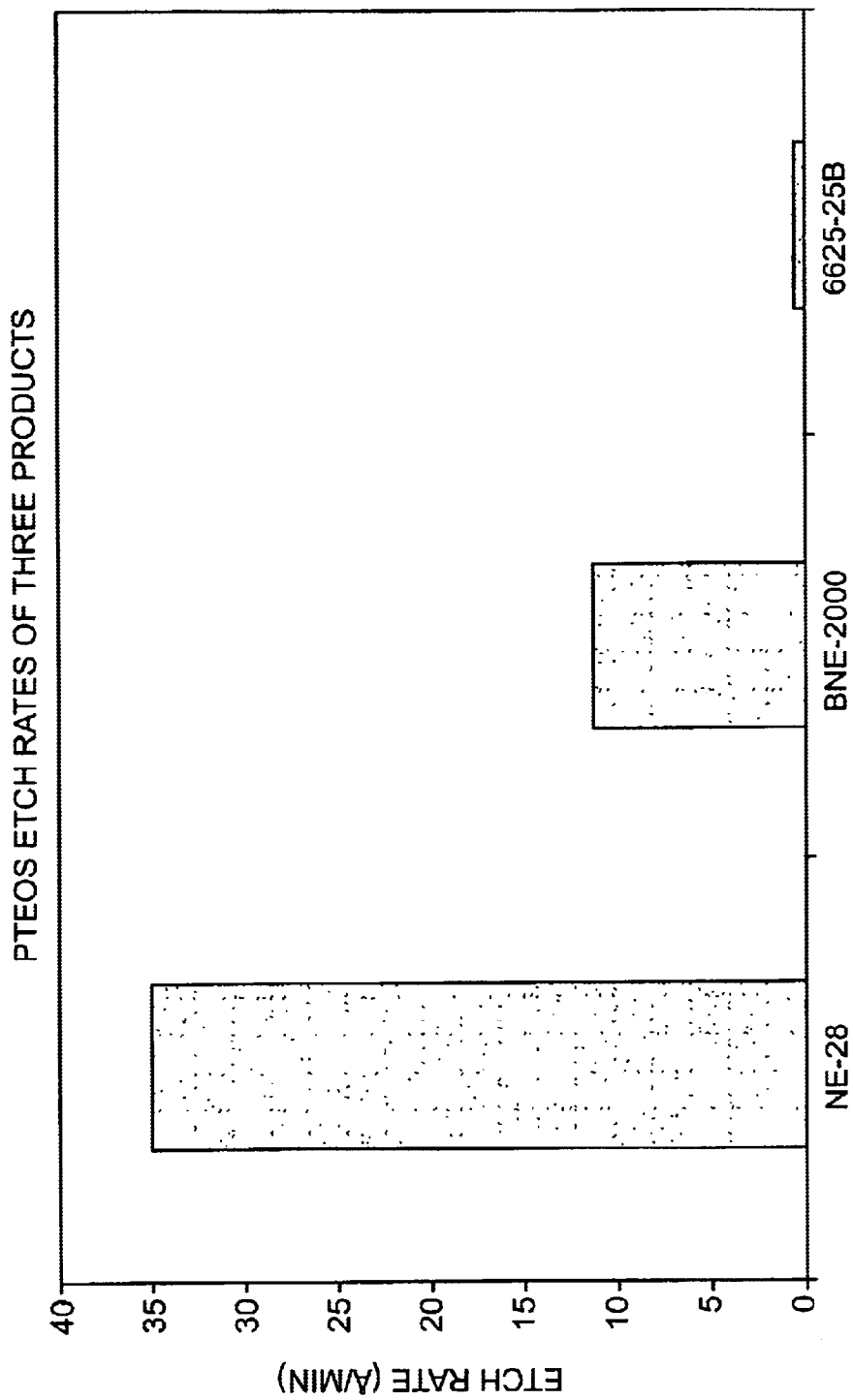
FIG. 4 compares the PTEOS etch rates of three products: an acetic acid buffered fluoride stripper, an aminosulfonic acid buffered fluoride stripper and example 8.
Figure 5:
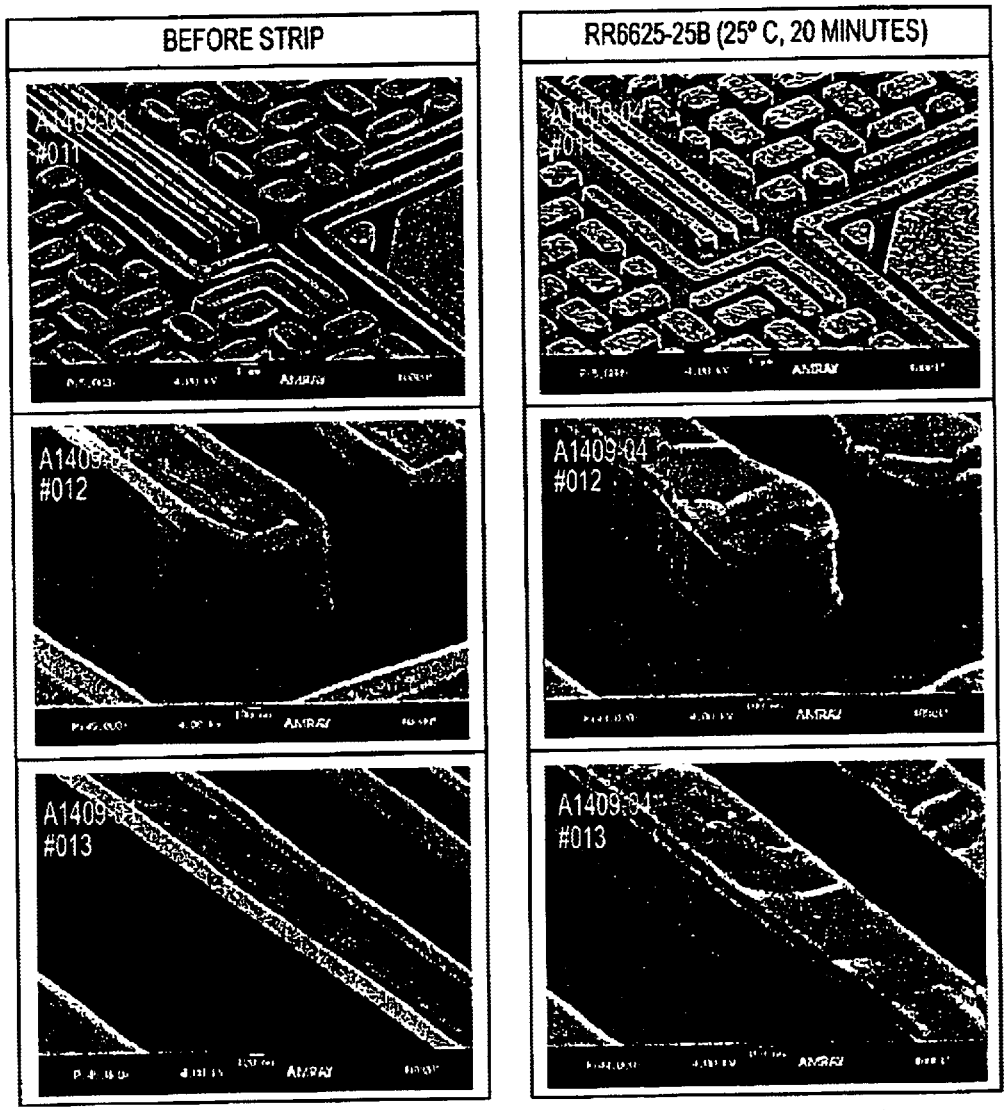
FIG. 5 shows cleaning performance results on aluminum lines.
Figure 6:
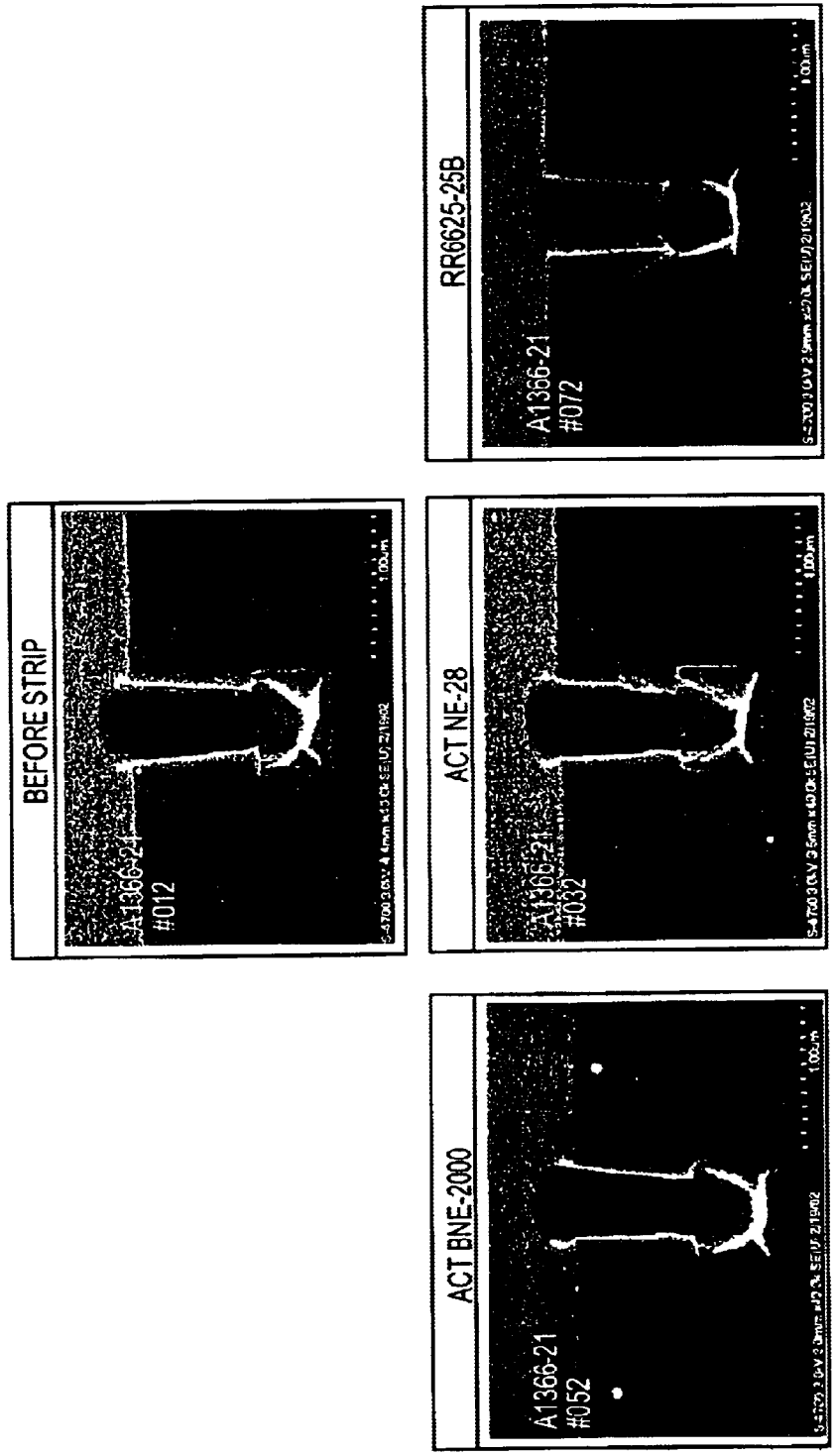
FIG. 6 shows cleaning performance results on sensitive oxide vias.

The present invention is concerned with selectively removing etching residues and especially residues cased by reactive ion etching. Moreover, the etching residues are present in an article that also includes metal, silicon, silicate and/or interlevel dielectric material such as deposited silicon oxides and derivitized silicon oxides such as TEOS and Spin-On Glass, wherein both the residues and the metal, silicon, silicide and/or interlevel dielectric materials will come in contact with the cleaning composition. The present invention provides for selectively removing the post etch residues without significantly attacking the metal, silicon, silicon dioxide and interlevel dielectric materials. The metal is typically copper, copper alloy, titanium, titanium nitride, tantalum, tantalum nitride, tungsten, titanium/tungsten, aluminum and/or aluminum alloys. The residues removed according to the present invention are preferably those created by reactive ion etching.

The compositions of the present invention comprise about 5 to 50% by weight, preferably about 20 to about 45%, and most preferably about 25 to about 30% by weight of water. The water employed is preferably deionized water.

In addition, the compositions of the present invention contain a dicarboxylic organic acid in an amount of 1 to about 20% by weight, preferably about 1 to about 10% by weight and most preferably about 2 to about 5% by weight.

The dicarboxylic acids can be saturated or unsaturated, straight or branched acyclic or cyclic.

Examples of suitable saturated acyclic acids include oxalic, malonic, succinic, glutaric and adipic acids. An example of an unsaturated acid is fumaric acid or maleic acid. Examples of cyclic acids are phthalic acid and terephthalic acid. The preferred acids are succinic acid, malonic acid, maleic acid, adipic acid and phthalic acid. The more preferred acids are maleic and adipic acids and the most preferred is adipic acid.

Surprisingly, according to the present invention, the presence of dicarboxylic acids in the compositon of the invention did not result in high oxide etch rates as would have been expected, based on the acidic pH of the stripper solutions. Instead, the oxide etch rates exhibited by the compositions are at most extremely low and in some cases are almost nonexistent. It has been observed that the inhibition of oxide etching requires the diacid and/or its salt. Compositions that do not include a diacid or salt thereof fail to exhibit the oxide etching inhibition achieved by the present invention.

In addition, the compositions of the present invention contain an organic or inorganic base, which in combination with an organic diacid, forms a buffering agent; typically in an amount of about 0.5 to about 20% by weight, preferably about 1 to about 10% by weight and most preferably about 2 to about 5% by weight.

The pH of these formulations can vary anywhere from 1 to about 7, and preferably about 5.5 to 6.0 depending on the specific diacid chosen and its effective buffering range. In particular, diacids are defined by two $pK_a$ values and a buffer is generally formed about 0.75 pH units on either side of a given pKa. For example, the pK values for malonic acid are $pK_1=2.8$ and $pK_2=5.7$. One can then expect malonic acid to act as a buffer between the pHs of 2.05–3.55 and again between 4.95–6.45. Similarly, the pK values for adipic acid are $pK_1=4.5$ and $pK_2=5.5$. Since the two pHs almost overlap, the effective buffering range of adipic acid is between the pHs of 3.75 and 6.25. Buffering has been shown to be important because both cleaning ability and dielectric and metal etching have some dependence on pH. A pH drift can cause significant variances in cleaning and substrate etching. For example, a semiaqueous fluoride stripper at pH=4.75 may not etch copper significantly, but at pH=7.5 or higher may severely attack copper, causing unacceptable loss of a device critical dimension.

Examples of suitable bases include, but are not limited to: ammonium hydroxide, amines, and quaternary ammonium hydroxides.

It is preferred that the base not include metal ions such as sodium and potassium since they tend to contaminate the substrate. The preferred bases are ammonium hydroxide or monoethanolamine (MEA).

Compositions of the present invention also include a fluoride ion source typically in an amount of about 0.1 to about 10% by weight, preferably about 0.1 to about 5% by weight and most preferably about 0.5 to about 3% by weight.

Typical compounds providing a fluoride ion source according to the present invention are hydrofluoric acid, ammonium fluoride, quaternary ammonium fluorides such as tetramethylammonium fluoride and tetrabutylammonium fluoride, fluoroborates, fluoroboric acid, tetrabutylammonium tetrafluoroborate, and aluminum hexafluoride. Also, a fluoride salt of an aliphatic primary, secondary or tertiary amine can be used. Such have the following formula:

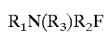

wherein $R_1$, $R_2$ and $R_3$ each individually represent H or an alkyl group,

Typically, the total number of carbon atoms in the $R_1$, $R_2$ and $R_3$ groups is 12 carbon atoms or less. The preferred fluoride compound is ammonium fluoride.

The compositions of the present invention also include 0% to about 80% by weight and more typically about 1% to about 80% by weight of a water miscible organic solvent. The preferred amount of water miscible organic solvent is about 30 to about 65% by weight and most preferably about 50 to about 60% by weight.

Examples of water miscible organic solvents include, but are not limited to, dimethylacetamide, N-methyl pyrrolidinone, dimethylsulfoxide, dimethylformamide, N-methylformamide, formamide, dimethyl-2-piperidone (DMPD), tetrahydrofurfuryl alcohol, glycerol, ethylene glycol, and other amides, alcohols or sulfoxides, or multi-functional compounds, such as hydroxyamides or aminoalcohols.

The preferred solvents, when employed, are dimethyl acetamide and dimethyl-2-piperidone and N-methylpyrrolidinone.

Also, if desired, the composition of the present invention can optionally include a corrosion inhibitor. When present, the corrosion inhibitor is employed typically in amounts up to about 10% by weight, preferably about 0.5 to about 5% by weight and most preferably about 1 to about 2% by weight.

Examples of corrosion inhibitors include, but are not limited to catechol, gallic acid, benzotriazole, resorcinol, other phenols, acids or triazoles.

In addition, it is preferred that the compositions of the present invention, when used on substrates containing copper do not contain benzotriazole which has a tendency to bind to copper surfaces. Benzotriazole is present in various prior art compositions.

Some examples of substrate compositions of the present invention are illustrated below in Table 1 and preferred compositions are illustrated in Table 2.

TABLE 1

| Component | Example 1 | Example 2 | Example 3 | Example 4 | Example 5 | Example 6 |
|---|---|---|---|---|---|---|
| dimethylacetamide | 60 | 60 | 60 | 60 | 60 | 60 |
| water | 29.8 | 31.3 | 29.3 | 30.8 | 33.55 | 32.55 |

TABLE 1-continued

| Component | | | | | | |
|---|---|---|---|---|---|---|
| succinic acid | 4 | 4 | | | | |
| malonic acid | | | 3.5 | 3.5 | | |
| adipic acid | | | | | 3 | |
| phthalic acid | | | | | | 4 |
| maleic acid | | | | | | |
| 28% NH4OH | 3.7 | 3.7 | 4.7 | 4.7 | 2.2 | 2.6 |
| 40% NH4F | 2.5 | 1 | 2.5 | 1 | 1.25 | 1.25 |
| pH (5% sol'n) | 5.44 | 5.42 | 5.72 | 5.41 | 5.67 | 5.7 |
| PTEOS etch rate | | | | | | |

| Component | Example 7 | Example 8 | Example 9 | Example 10 | Example 11 | Example 12 |
|---|---|---|---|---|---|---|
| dimethylacetamide | 60 | 60 | 60 | 60 | 60 | 60 |
| water | 31.75 | 30.85 | 33.5 | 34.75 | 31.59 | 30.5 |
| succinic acid | 4 | 4 | 4 | | | |
| malonic acid | | | | | | |
| adipic acid | | | | 3 | | |
| phthalic acid | | | | | | |
| maleic acid | | | | | 4 | 4 |
| 28% NH4OH | 3 | 3.9 | 1.25 | 1 | 3.16 | 4.25 |
| 40% NH4F | 1.25 | 1.25 | 1.25 | 1.25 | 1.25 | 1.25 |
| pH (5% sol'n) | 5.36 | 6.17 | 4.39 | 4.77 | 6.15 | 7 |
| PTEOS etch rate | 17.94 | 4.25 | 64 | 38.55 | 1.35 | 0.29 |

TABLE 2

Preferred Formulations

| Component | Example 7 | Example 8 | Example 9 | Example 10 | Example 11 | Example 12 |
|---|---|---|---|---|---|---|
| dimethyl-acetamide | 60 | 60 | 60 | 60 | 60 | 60 |
| DI water | 29.8 | 31.05 | 27.3 | 34.75 | 33.75 | 32.5 |
| maleic acid | 4 | 4 | 4 | 4 | | |
| adipic acid | | | | | 3 | 3 |
| monoethanol-amine | | | | | 2 | 2 |
| 28% ammonium hydroxide | 3.7 | 3.7 | 3.7 | | | |
| 40% ammonium fluoride | 2.5 | 1.25 | 5 | 1.25 | 1.25 | 2.5 |
| pH (5% solution) | 6.48 | 6.59 | 6.55 | 2.37 | 5.6 | 5.5 |

Table 3 below shows selected acid pKa values and expected effective buffering ranges.

TABLE 3

Acid pKa values and effective buffering range

| diacid | mol. wt. | pK1, pK2 | buffering range |
|---|---|---|---|
| oxalic | 90.04 | 1.27, 4.27 | .52–2.02, 3.52–5.02 |
| malonic | 104.06 | 2.8, 5.7 | 2.05–3.55, 4.95–6.45 |
| succinic | 118.09 | 4.2, 5.63 | 3.45–6.38 | |
| glutaric | 132.12 | 3.8, 6.08 | 3.05–4.55, 5.33–6.83 |
| adipic | 146.14 | 4.4, 5.4 | 3.65–6.15 | |
| maleic | 116.07 | 1.9, 6.3 | 1.15–2.65, 5.55–7.05 |
| fumaric | 116.07 | | |
| phthalic | 166.13 | | |
| acetic | 60.05 | 4.75 | 4.0–5.5 |
| acrylic | 72.06 | | |
| HEPES | 238.31 | 7.6 | 6.85–8.35 | |

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A composition suitable for removing etching residue which comprises:
   a. up to about 80% by weight of a water miscible organic solvent;
   b. about 5 to about 50% by weight of water;
   c. about 1 to 20% by weight of a dicarboxylic organic acid;
   d. about 0.5 to about 20% by weight of a base, which in combination with the above dicarboxylic organic acid forms a buffering agent; and
   e. about 0.1 to about 10% by weight of a source of fluoride ion.

2. The composition of claim 1 wherein the dicarboxylic organic acid is selected from the group consisting of oxalic acid, malonic acid, succinic acid, glutaric acid, adipic acid, fumaric acid, maleic acid, phthalic acid and terephthalic acid.

3. The composition of claim 1 wherein the dicarboxylic organic acid is selected from the group consisting of succinic acid, malonic acid, maleic acid, adipic acid and phthalic acid.

4. The composition of claim 1 wherein the dicarboxylic organic acid is maleic acid or adipic acid.

5. The composition of claim 1 wherein the dicarboxylic organic acid is adipic acid.

6. The composition of claim 1 wherein the base is selected from the group consisting of ammonium hydroxide, amines, and quaternary ammonium hydroxides.

7. The composition of claim 1 wherein the base comprises ammonium hydroxide or monoethanolamine.

8. The composition of claim 1 wherein the fluoride ion source is selected from the group consisting of hydrofluoric acid, ammonium fluoride, quaternary ammonium fluorides, fluoroborates, fluoroboric acid, tin bifluoride, antimony fluoride, tetrabutylammonium tetrafluoroborate, aluminum hexfluoride, and a fluoride salt of an alphatic primary, secondary or tertiary amine having the following formula:

$$R_1N(R_3)R_2$$

wherein $R_1R_2$ and $R_3$ each individually represent H or an alkyl group.

9. The composition of claim 1 wherein the fluoride ion source comprises ammonium fluoride.

10. The composition of claim 1 wherein the amount of water miscible organic solvent is about 1% to about 80% by weight.

11. The composition of claim 1 wherein the pH is about 1 to about 7.

12. The composition of claim 1 wherein the pH is about 5.5 to about 6.

13. The composition of claim 1 being free from benzotriazole.

14. The composition of claim 10 wherein the water miscible organic solvent is selected from the group consisting of dimethylacetamide, N-methyl pyrrolididinone, dimethylsulfoxide, dimethyformamide, N-methyformamide, formamide, dimethyl-2-piperidone, tetrahydrofurfuryl alcohol, glycerol, and ethylene glycol.

15. The composition of claim 10 wherein the water miscible organic solvent is selected from the group consisting of dimethylacetamide, dimethyl-2-piperidone, or N-methyl pyrrolidinone.

* * * * *